United States Patent
Kim et al.

(10) Patent No.: US 12,110,433 B2
(45) Date of Patent: Oct. 8, 2024

(54) CARBON DOTS EMITTING LIGHT HAVING MULTIPLE COLORS AND METHOD OF FABRICATING THE SAME

(71) Applicant: Korea Advanced Institute of Science and Technology, Daejeon (KR)

(72) Inventors: DoHyun Kim, Daejeon (KR); Hyojeong Yoo, Daejeon (KR); Byeong Eun Kwak, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 260 days.

(21) Appl. No.: 17/401,605

(22) Filed: Aug. 13, 2021

(65) Prior Publication Data
US 2022/0333009 A1    Oct. 20, 2022

(30) Foreign Application Priority Data

Apr. 16, 2021    (KR) .................. 10-2021-0049533

(51) Int. Cl.
*C09K 11/65*    (2006.01)
*H01L 33/50*    (2010.01)

(52) U.S. Cl.
CPC ............ *C09K 11/65* (2013.01); *H01L 33/502* (2013.01); *H01L 33/508* (2013.01)

(58) Field of Classification Search
CPC .............................. C09K 11/65; H01L 33/508
See application file for complete search history.

(56) References Cited

U.S. PATENT DOCUMENTS

2018/0273862 A1*    9/2018    Ettefaghi .............. C10L 1/1208

OTHER PUBLICATIONS

Hyo Jeong Yoo, Byeong Eun Kwak and Do Hyun Kim, Interparticle distance as a key factor for controlling the dual-emission properties of carbon dots, Phys. Chem. Chem. Phys., 2020, 22, 20227-20237 (Year: 2020).*

Jingfang Shangguan, Dinggeng He, Xiaoxiao He, Kemin Wang, Fengzhou Xu, Jinquan Liu, Jinlu Tang, Xue Yang, and Jin Huang Label-Free Carbon-Dots-Based Ratiometric Fluorescence pH Nanoprobes for Intracellular pH Sensing,Anal. Chem. 2016, 88, 7837-7843 (Year: 2016).*

M. N. Egorova, A. N. Kapitonov, A. A. Alekseev, and E. A. Obraztsova, Properties of Carbon Dots Synthesized Solvothermally From Citric Acid and Urea , Journal of Structural Chemistry, 2020, vol. 61, No. 5, pp. 811-817. (Year: 2020).*

Shangguan et al., "Label-Free Carbon-Dots-Based Ratiometric Fluorescence pH Nanoprobes for Intracellular pH Sensing", Analytical Chemistry, 2016, 88, 7837-7843 DOI: 10.1021/acs.analchem.6b01932.

(Continued)

*Primary Examiner* — Bijan Ahvazi
(74) *Attorney, Agent, or Firm* — Verrill Dana, LLP

(57) ABSTRACT

Various embodiments provide carbon dots emitting light having multiple colors and a method of fabricating the same. According to various embodiments, the carbon dots include at least two structural characteristics. At least two emission levels indicative of different emission wavelengths, respectively, may be introduced into the carbon dots based on the structural characteristics. A ratio of emission colors of the carbon dots may be adjusted when the carbon dots are synthesized or after the carbon dots are synthesized.

16 Claims, 15 Drawing Sheets

(56) References Cited

OTHER PUBLICATIONS

Yoo et al., "Interparticle distance as a key factor for controlling the dual-emission properties of carbon dots", Phys. Chem. Chem. Phys. 2020, 22, 20227-20237 DOI: 10.1039/d0cp02120b.

Zhan, J. et al., "A solvent-engineered molecule fusion strategy for rational synthesis of carbon quantum dots with multicolor bandgap fluorescence", Carbon, (2018), 130, pp. 153-163.

Yoo, H.J. et al., "Competition of the roles of π-conjugated domain between emission center and quenching origin in the photoluminescence of carbon dots depending on the interparticle separation", Carbon, (2021), 183, pp. 560-570.

* cited by examiner

CARBON DOTS EMITTING LIGHT HAVING MULTIPLE COLORS AND METHOD OF FABRICATING THE SAME

CROSS-REFERENCES TO RELATED APPLICATIONS

This application is based on and claims priority under 35 U.S.C. 119 to Korean Patent Application No. 10-2021-0049533, filed on Apr. 16, 2021 in the Korean intellectual property office, the disclosures of which are herein incorporated by reference in their entireties.

TECHNICAL FIELD

Various embodiments relate to carbon dots emitting light having multiple colors and a method of fabricating the same.

BACKGROUND OF THE INVENTION

In general, a fluorescent substance is a substance that emits fluorescence, and is used in various fields, such as a fluorescent lamp, a cathode ray tube, a vacuum fluorescent display, a plasma display, an LED, and a polyhouse. For the technical application of such a fluorescent substance, fluorescent substances emitting light having multiple colors are required. However, the existing fluorescent substance has limitations in being applied to products used in real life due to problems, such as toxicity, scarcity, and an environmental pollution, because the fluorescent substance includes rare earth metals, heavy metals, etc.

Unlike the existing fluorescent substance, carbon dots have advantages in that they are free of toxicity and environmental pollution problems and are advantageous in low-cost mass production because a plenty of precursors are present. Such carbon dots have advantages of strong fluorescence, high photostability, etc. as a fluorescent substance, and are easy to be sensed through an interaction with a functional group of a target material because various functional groups are present on surfaces of the carbon dots. In actual applications, however, in order to perform functions, such as the implementation of a mixed color and the improvement of sensing accuracy, a fluorescent substance emitting light having multiple colors is implemented by bonding carbon dots having single emission to other fluorescent particles, such as quantum dots or metal nano particles. However, if the carbon dots are bonded to other fluorescent particles, a multi-step process is required, and the toxicity or scarcity problem still remains in the quantum dots or the metal nano particles.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Various embodiments provide carbon dots emitting light having multiple colors and a method of fabricating the same.

Various embodiments provide carbon dots capable of adjusting a ratio of emission colors and also emitting light having multiple colors, and a method of fabricating the same.

According to various embodiments, a method of fabricating carbon dots emitting light having multiple colors includes preparing at least one organic precursor and synthesizing the carbon dots by reacting the organic precursors with each other. The carbon dots may include at least two structural characteristics. At least two emission levels indicative of different emission wavelengths, respectively, may be introduced into the carbon dots based on the structural characteristics.

According to various embodiments, carbon dots emitting light having multiple colors include at least two structural characteristics. At least two emission levels indicative of different emission wavelengths, respectively, may be introduced into the carbon dots based on the structural characteristics.

According to various embodiments, the carbon dots emitting light having multiple colors can be implemented. That is, the carbon dots can have various emission levels based on a structural diversity, and thus can simultaneously emit at least two emission colors as a single fluorescent substance. In this case, relative intensities of the emission colors of the carbon dots can be adjusted. In other words, the carbon dots having desired emission colors and relative intensities thereof can be implemented. For this reason, the carbon dots can be applied to various fields, such as lights, displays, energy conversion, data encryption, sensing, and bio imaging, without requirements for an additional fluorescent substance.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

While illustrative embodiments have been illustrated and described, it will be appreciated that various changes can be made therein without departing from the spirit and scope of the invention.

Hereinafter, various embodiments of this document are described with reference to the accompanying drawings.

Figure 1:
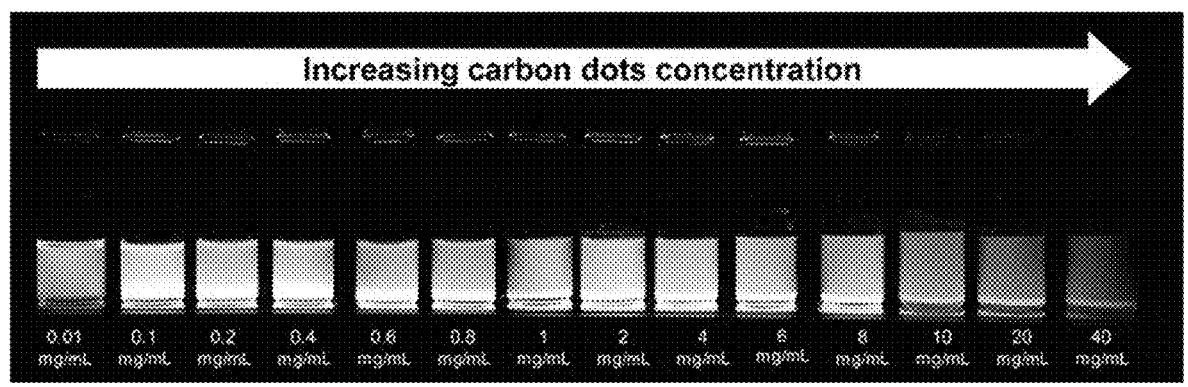
FIG. 1 is an image illustrating carbon dots emitting light having multiple colors according to various embodiments.

FIG. 1 is an image illustrating carbon dots emitting light having multiple colors according to various embodiments.

Figure 2:
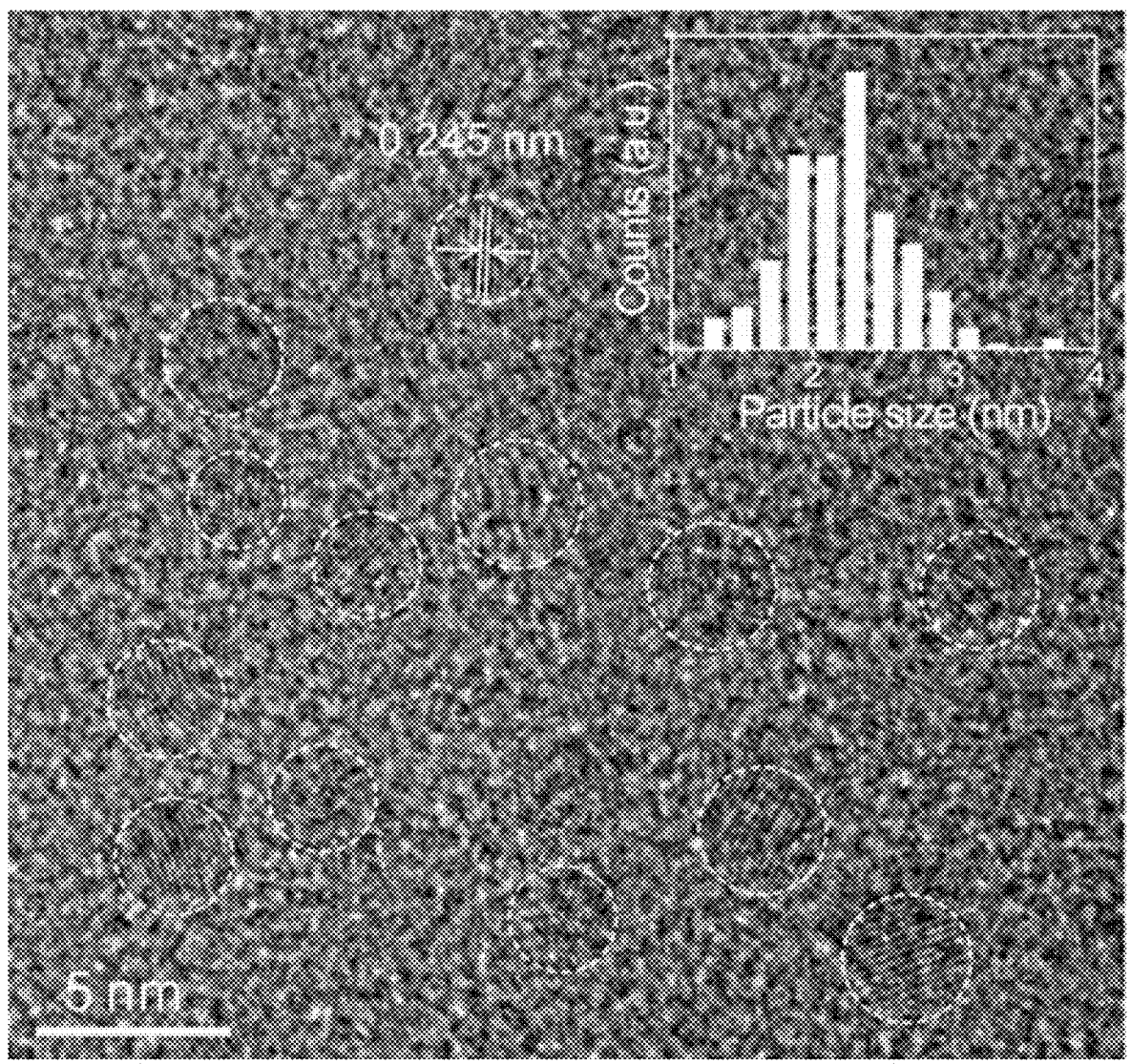
FIG. 2 is an image of carbon dots by using a transmission electronic microscope according to various embodiments.
Figure 3A:
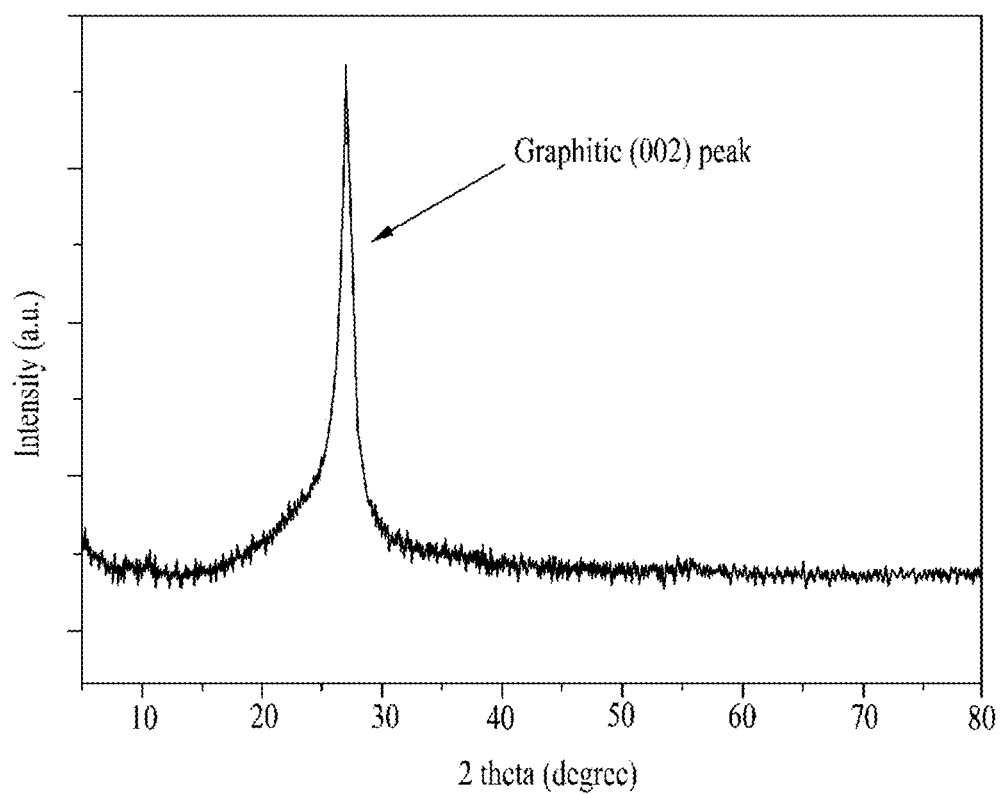
FIG. 3A is a graph illustrating the results of X-ray diffraction analysis of carbon dots according to various embodiments.
Figure 3B:
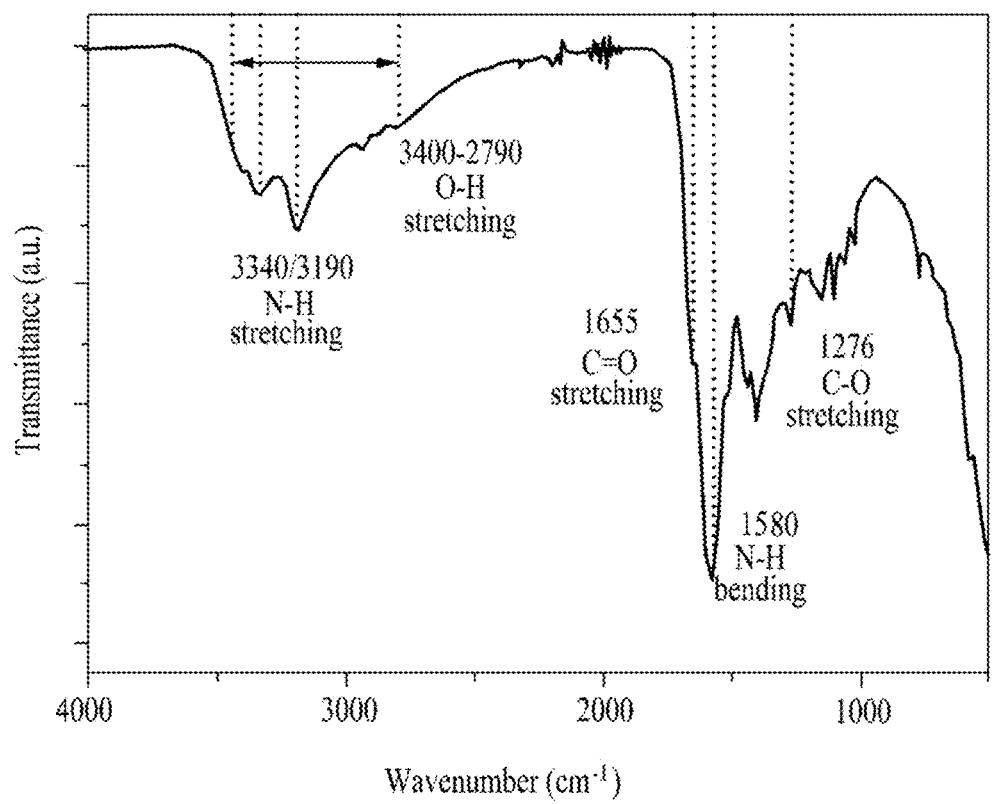
FIG. 3B is a graph illustrating the results of Fourier transform infrared spectroscopy for carbon dots according to various embodiments.
Figure 4:
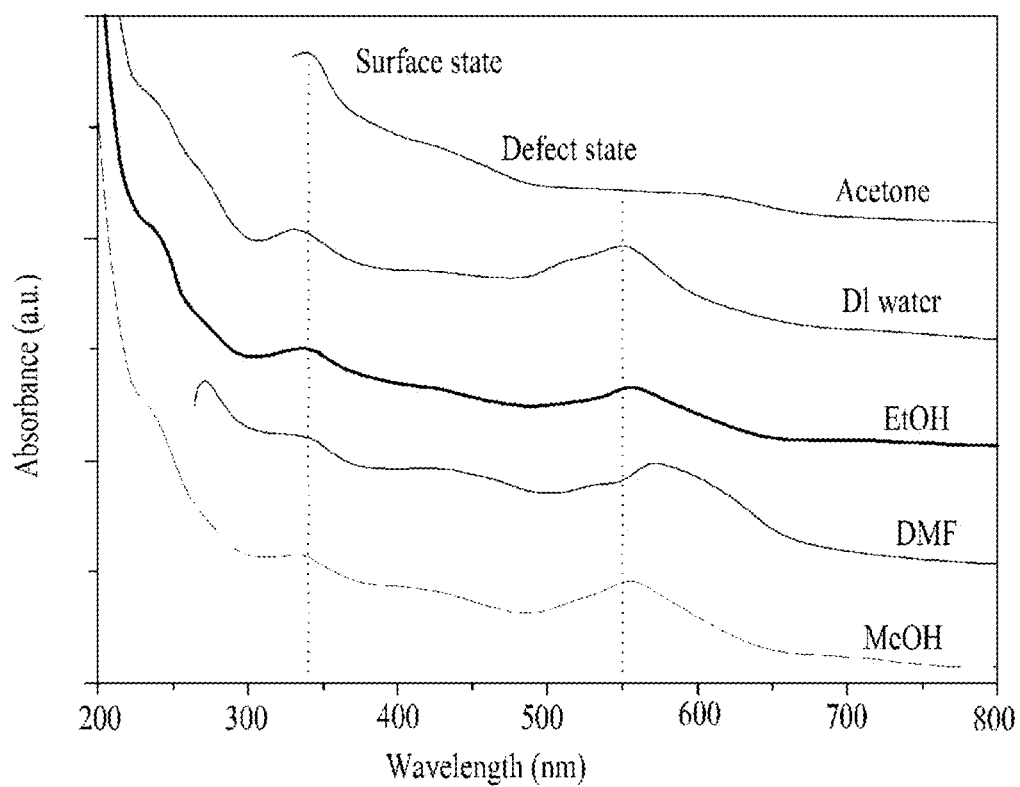
FIG. 4 is a graph illustrating absorption spectra of carbon dots in various solvents according to various embodiments.

FIG. 2 is an image of carbon dots by using a transmission electronic microscope according to various embodiments. FIG. 3A is a graph illustrating the results of X-ray diffraction analysis of carbon dots according to various embodiments. FIG. 3B is a graph illustrating the results of Fourier transform infrared spectroscopy for carbon dots according to various embodiments. FIG. 4 is a graph illustrating absorption spectra of carbon dots in various solvents according to various embodiments.

Referring to FIG. 1, various embodiments may provide carbon dots emitting light having multiple colors. That is, the carbon dots may simultaneously emit in at least two emission colors for a given a single excitation wavelength. For example, the single excitation wavelength may include at least some of bands of 200 nm to 800 nm. For example, the carbon dots may show blue emission and red emission as illustrated in FIG. 1. The carbon dots may be implemented in a uniform size as illustrated in FIG. 2.

To this end, the carbon dots may include at least two structural characteristics. In this case, each of the structural characteristics may be one of carbonaceous, a surface functional group, a fluorescent organic molecule, or a core defect structure. For example, as illustrated in FIG. 3A, the carbon dots may show strong crystallizability, and may consist of a hard core defect structure, and a surface functional group surrounding the core defect structure. Accordingly, at least two emission levels indicative of different emission wavelengths may be introduced into the carbon dots based on the structural characteristics. For example, as illustrated in FIG. 3B, the carbon dots may have multiple emission levels. For example, each of the emission wavelengths may include some of bands of 200 nm to 800 nm. In this case, each of the emission levels may be one of a core level, a surface level, a fluorescent molecule level, or a defect level. Furthermore, a ratio of emission colors of the carbon dots may be determined. The ratio of the emission colors of the carbon dots may indicate a peak height in each of the emission wavelengths of emission spectra of the carbon dots, a height up to an internal division point of the peak height when each of the peak heights is internally divided at the same ratio, or a ratio of the peak widths. In this case, as illustrated in FIG. 4, the blue emission and red emission of the carbon dots have been derived in the surface level and the defect level. The ratio of the emission colors of the carbon dots may be determined based on a relative intensity between the blue emission and the red emission. In some embodiments, the carbon dots may be synthesized using one of a solvent thermal synthesis method or a thermal synthesis method using microwaves or ultrasonic waves, for example.

According to various embodiments, a ratio of the emission colors of the carbon dots may be adjusted. For example, as illustrated in FIG. 1, the ratio of the emission colors of the carbon dots may be adjusted with respect to relative intensities between blue emission and red emission. In this case, the ratio of the emission colors may be adjusted by adjusting at least one of a level of relative emission contribution of each of emission levels or an absolute quantity of each of the emission level. According to an embodiment, the level of relative emission contribution of each of emission levels may be adjusted after the carbon dots are synthesized. According to another embodiment, the absolute quantity may be adjusted while the carbon dots are synthesized.

Figure 5:
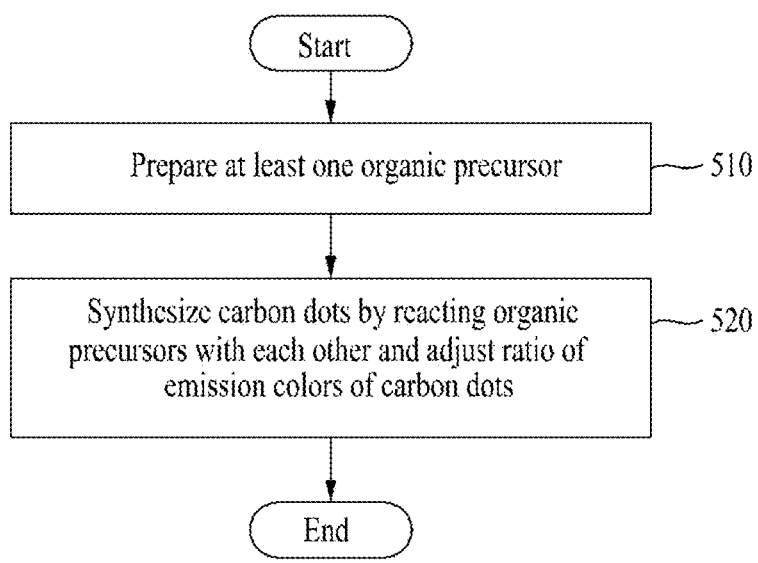
FIG. 5 is a flowchart illustrating a method of fabricating carbon dots according to various embodiments.
Figure 6A:
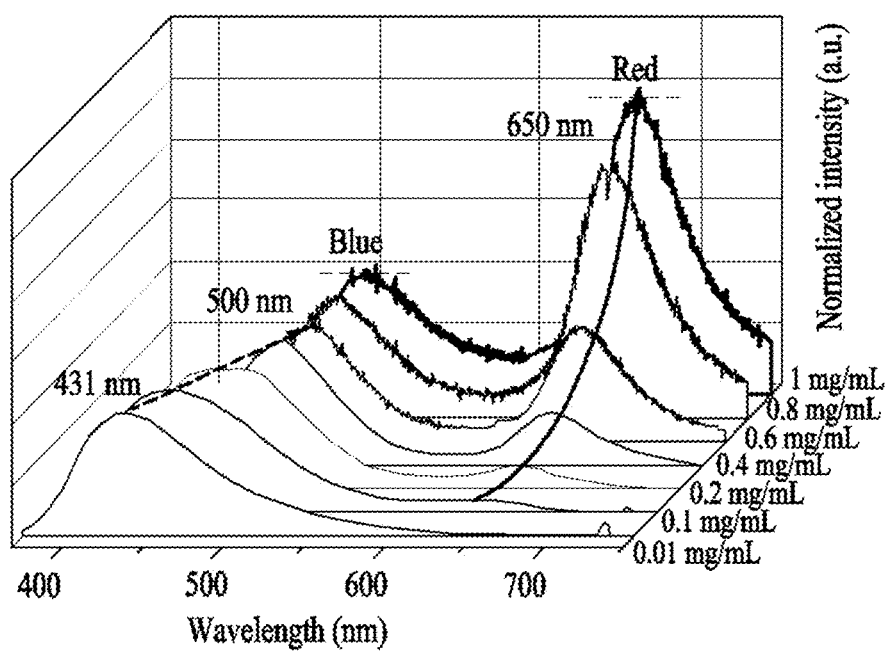
FIGS. 6A, 6B, 7, 8A, 8B, 9, and 10 are graphs for describing adjusting a ratio of emission colors of carbon dots according to various embodiments.
Figure 6B:
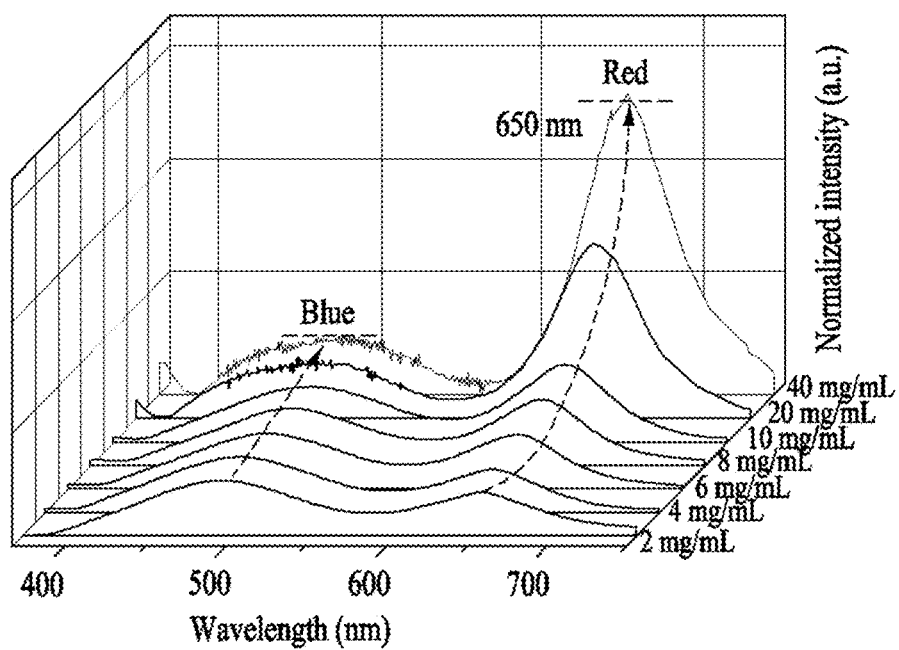
Figure 7:
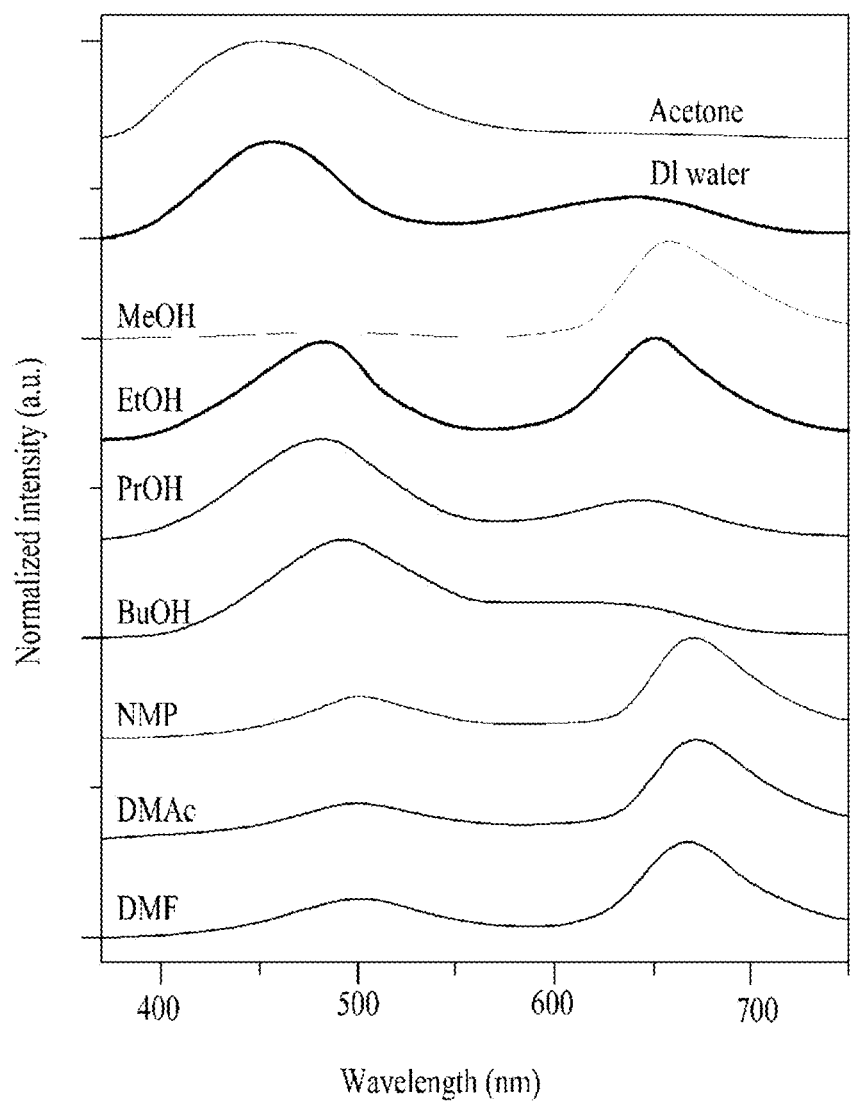
Figure 8A:
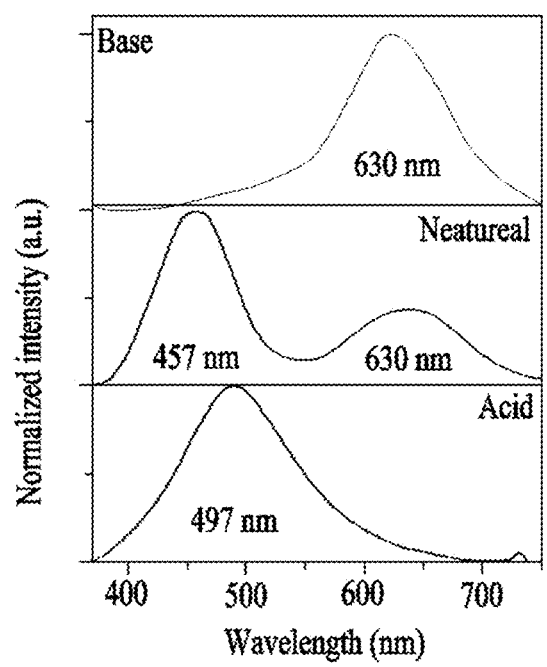
Figure 8B:
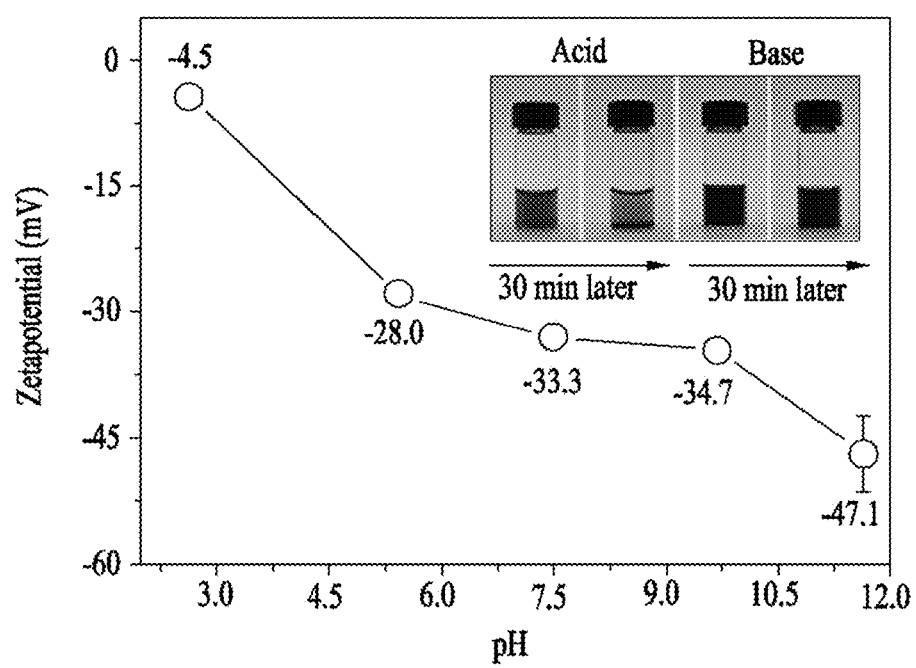

FIG. 5 is a flowchart illustrating a method of fabricating carbon dots according to various embodiments. FIGS. 6, 7, 8, 9, and 10 are graphs for describing adjusting a ratio of emission colors of carbon dots according to various embodiments. In this case, FIGS. 6, 7, 8(a), 9, and 10 are graphs illustrating emission spectra of carbon dots according to various embodiments. FIG. 8(b) is a graph illustrating a Zeta potential change according to a pH change of a dispersion solution in which carbon dots are dispersed according to various embodiments.

Referring to FIG. 5, in step 510, at least one organic precursor may be prepared. In this case, the organic precursor may include an organic matter including a nitrogen element. For example, the organic precursor may include at least one of citric acid or urea. In this case, if two organic precursors are prepared, citric acid 1 g and urea 2 g may be prepared.

In step 520, carbon dots may be synthesized by reacting the organic precursors with each other. The carbon dots may show multiple colors. That is, the carbon dots may simultaneously emit light having at least two emission colors for a given a single excitation wavelength. For example, the single excitation wavelength may include at least some of bands of 200 nm to 800 nm. For example, as illustrated in FIG. 1, the carbon dots may show blue emission and red emission. The carbon dots may be implemented in a uniform size, as illustrated in FIG. 2.

To this end, the carbon dots may include at least two structural characteristics. In this case, each of the structural characteristics may be one of carbonaceous, a surface functional group, a fluorescent organic molecule, or a core defect structure. In this case, the structural characteristics may be bonded together through a double bond, for example, an sp2 bond. Accordingly, at least two emission levels indicative of different emission wavelengths, respectively, may be introduced into the carbon dots based on the structural characteristics. For example, each of the emission wavelengths may include some of bands of 200 nm to 800 nm. In this case, each of the emission levels may be one of the core level, the surface level, the fluorescent molecule level, or the defect level. Furthermore, a ratio of emission colors of the carbon dots may be determined. The ratio of the emission colors of the carbon dots may indicate a peak height in each of the emission wavelengths of emission spectra of the carbon dots, a height up to an internal division point of the peak height when each of the peak heights is internally divided at the same ratio, or a ratio of the peak widths. In this case, as illustrated in FIG. 4, the blue emission and red emission of the carbon dots may be derived in the surface level and the defect level. The ratio of the emission colors of the carbon dots may be determined based on a relative intensity between the blue emission and the red emission.

In some embodiments, carbon dots may be synthesized using one of a solvent thermal synthesis method or a thermal synthesis method using microwaves or ultrasonic waves, for example. For example, if two organic precursors, that is, citric acid and urea, are prepared, citric acid may construct carbonaceous, and urea may construct a structural characteristic other than that of carbonaceous.

According to an embodiment, carbon dots may be synthesized using the solvent thermal synthesis method to be described later. First, after an organic precursor is dispersed within an organic solvent, a mixed solution of the organic precursor and the organic solvent may be heated. For example, the organic solvent may be dimethylformamide (DMF). Furthermore, the mixed solution may be heated at about 200° C. for about 12 hours. While the mixed solution is heated, the organic precursors may react with each other within the organic solvent. Thereafter, the heated solution may be cooled at room temperature. For example, the heated solution may be cooled for about 1 hour. Accordingly, a reddish-black solution may be left. Next, the organic solvent may be removed from the cooled solution. To this end, the cooled solution may be diluted at a volume ratio of 1:10 with respect to a solution in which ethyl acetate and petroleum ether are mixed at a ratio of 4:1. Centrifugation may be performed on the cooled solution at about 7500 rpm for 10 minutes. Accordingly, a supernatant including at least some of the organic solvent may be removed. Additionally, the remainder of the organic solvent may be removed by heating the remaining solution in a vacuum oven for about 12 hours or more. Accordingly, the carbon dots may be obtained.

According to various embodiments, in step 520, a ratio of the emission colors of the carbon dots may be adjusted. For example, as illustrated in FIG. 1, the ratio of the emission colors of the carbon dots may be adjusted with respect to relative intensities between blue emission and red emission. The ratio of the emission colors may indicate a peak height in each of the emission wavelengths of emission spectra of the carbon dots, a height up to an internal division point of the peak height when each of the peak heights is internally divided at the same ratio, or a ratio of the peak widths. In this case, the ratio of the emission colors may be adjusted by adjusting at least one of a level of relative emission contribution of each of emission levels or an absolute quantity of each of the emission levels.

According to an embodiment, after carbon dots are synthesized, a ratio of the emission colors of the carbon dots may be adjusted. In this case, a level of relative emission contribution of each of emission levels may be adjusted. The level of relative emission contribution may be adjusted by dispersing the carbon dots within a dispersion solution. Alternatively, after the carbon dots are dispersed within the dispersion solution, the level of relative emission contribution may be adjusted by exciting a solution in which the carbon dots and the dispersion solution are mixed in various wavelengths. In this case, the level of relative emission contribution may be adjusted based on at least one of a concentration of the carbon dots within the dispersion solution, the type of the dispersion solution, pH of the dispersion solution, or the excited wavelength.

For example, when one of two emission levels of carbon dots is the surface level and the other thereof is the defect level, a level of relative emission contribution of each emission level may be adjusted based on a concentration of carbon dots within a dispersion solution. The dispersed solution may be one of DI water or an organic solvent, for example, dimethylformamide (DMF). The concentration may be determined as any one value of about 0.01 mg/mL to about 100 mg/mL, and may be preferably determined as any one value of 0.01 mg/mL to about 40 mg/mL. In this case, as the concentration of the carbon dots within the dispersion solution is increased, a level of relative emission contribution of the surface level to the defect level may be decreased. In this case, when the level of relative emission contribution of the surface level to the defect level is decreased, a relative intensity of red emission for blue emission may be increased. In other words, as illustrated in FIGS. 6A and 6B, as a concentration of carbon dots within a dispersion solution is increased, a relative intensity of red emission for blue emission may be increased.

For another example, when one of two emission levels of carbon dots is the defect level and the other thereof is the defect level, a level of relative emission contribution of each emission level may be adjusted depending on the type of the dispersion solution. The dispersed solution may be one of DI water or an organic solvent, for example, acetone, methanol (MeOH), ethanol (EtOH), 1-propanol (PrOH), 1-butanol (BuOH), 1-methyl-2-pyrrolidone (NMP), dimethylacetamide (DMAc), or dimethylformamide (DMF). In this case, as the dispersibility of the dispersion solution is increased, a level of relative emission contribution of the defect level to the surface level may be increased. In this case, when the level of relative emission contribution of the defect level to the surface level is increased, a relative intensity of red emission for blue emission may be increased. In other words, as illustrated in FIG. 7, as the dispersibility of the dispersion solution is increased, the relative intensity of red emission for blue emission may be increased.

Furthermore, for example, when one of two emission levels of carbon dots is the defect level and the other thereof is the surface level, a level of relative emission contribution of each emission level may be adjusted based on pH of a dispersion solution. pH may be determined as any one value of about 0 to about 14. By dispersing the carbon dots within an aqueous sulfuric acid solution of 0.1 M, that is, a strong acid condition, the dispersibility of the carbon dots may be decreased, so that a level of relative emission contribution of the surface level to the defect level may be increased. In this case, when the dispersibility of the carbon dots is decreased, a relative intensity of blue emission for red emission may be increased. In other words, as illustrated in FIGS. 8A and 8B, as pH of the dispersion solution is decreased, the dispersibility of the carbon dots may be decreased. Accordingly, a relative intensity of blue emission for red emission may be increased. Alternatively, by dispersing the carbon dots within an aqueous sodium hydroxide solution of 0.1 M, the dispersibility of the carbon dots may be increased, so that a level of relative emission contribution of the defect level to the surface level may be adjusted. In this case, when the dispersibility of the carbon dots is increased, a relative intensity of red emission for blue emission may be increased. In other words, as illustrated in FIGS. 8A and 8B, as pH of the dispersion solution is increased, the dispersibility of the carbon dots may be increased. Accordingly, a relative intensity of red emission for blue emission may be increased.

Figure 9:
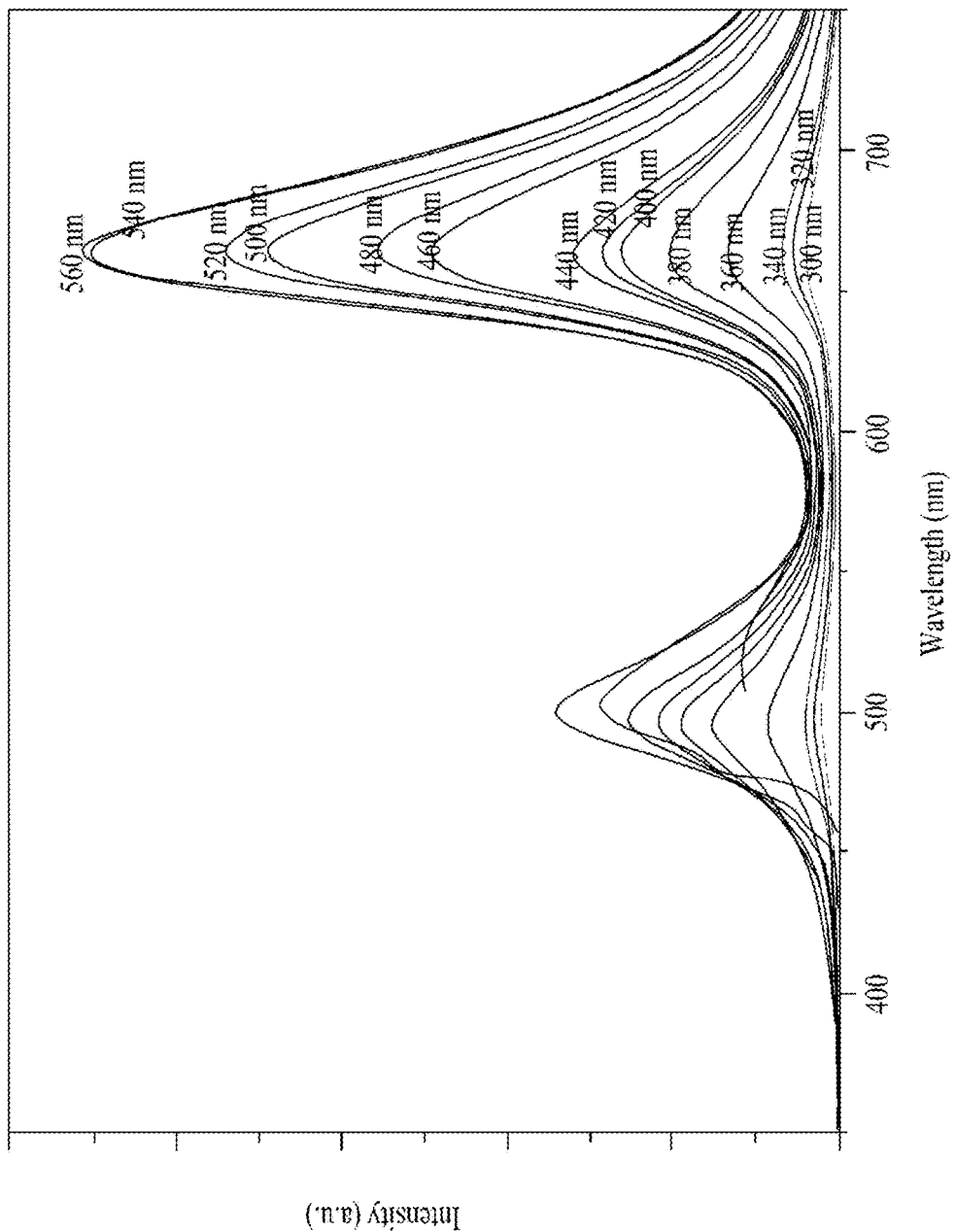

Furthermore, for example, when carbon dots having two types of emission levels have different optimum excitation wavelengths, a level of relative emission contribution of each of the two emission levels may be adjusted based on a wavelength excited in a solution in which the carbon dots and a dispersion solution are mixed. The excited wavelength may be determined within a range of 300 nm to 560 nm. In this case, as energy of the excited wavelength is decreased, a level of relative emission contribution of an emission level emitted in a relatively long wavelength may be increased. In this case, when the level of relative emission contribution of the emission level emitted in the relatively long wavelength is increased, a relative intensity of red emission for blue emission may be increased. When the dispersed solution is dimethylformamide (DMF) and a concentration of the carbon dots within the dispersion solution is 1 mg/mL, as a result of measurement performed by increasing the excited wavelength at intervals of 20 nm from 300 nm to 560 nm, a relative intensity of red emission for blue emission may be increased as an excited wavelength is increased as illustrated in FIG. 9.

According to another embodiment, while carbon dots are synthesized, a ratio of emission colors of the carbon dots may be adjusted. In this case, an absolute quantity of at least one of the emission levels may be adjusted. In this case, the absolute quantity may be adjusted based on at least one of a reaction time or a reaction temperature necessary to synthesize the carbon dots.

Figure 10:
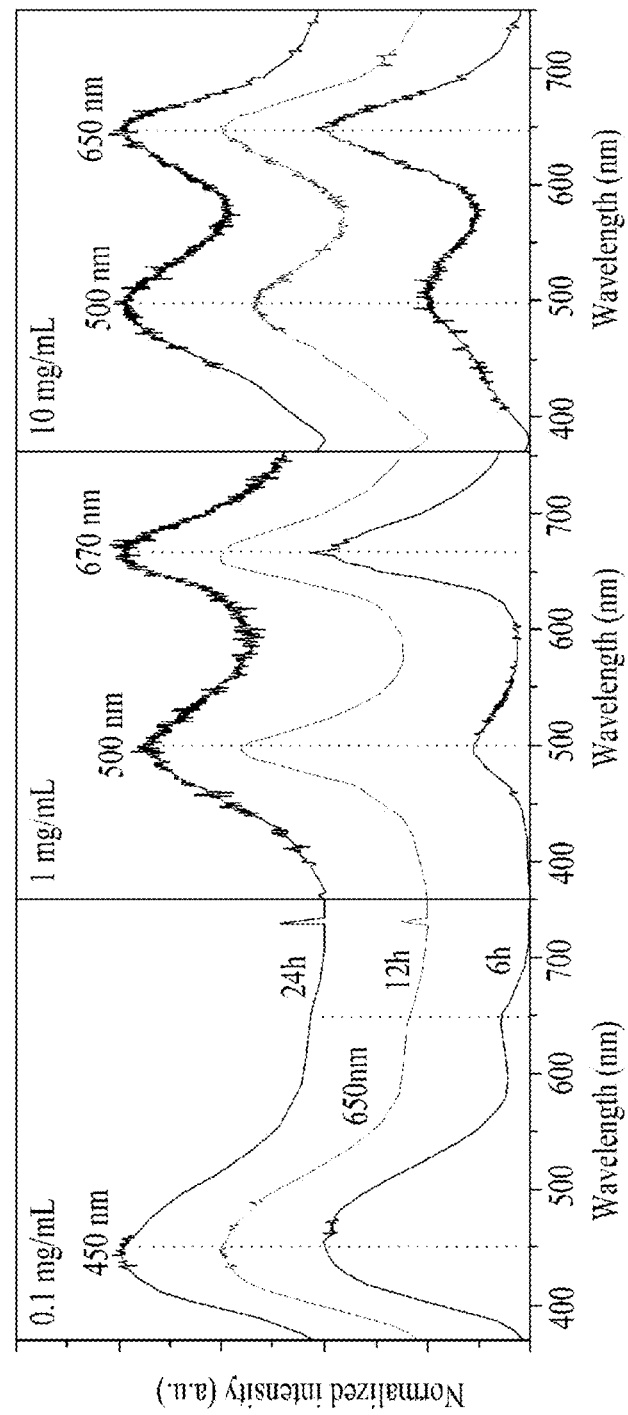

For example, when one of emission levels of carbon dots is the defect level, a relative quantity of the defect level may be adjusted based on a reaction time. In this case, as the reaction time is decreased, the relative quantity of the defect level may be increased. In this case, when the relative quantity of the defect level is increased, a relative intensity of red emission for blue emission may be increased. In other words, as illustrated in FIG. 10, as the reaction time is decreased, a relative intensity of red emission for blue emission may be increased.

According to various embodiments, carbon dots emitting light having multiple colors may be implemented. That is, the carbon dots may have various emission levels based on a structural diversity, and thus may simultaneously emit light having at least two emission colors as a single fluorescent substance. In this case, relative intensities of the emission colors of the carbon dots may be adjusted. In other words, carbon dots having desired emission colors and relative intensities thereof can be implemented. For this reason, the carbon dots may be applied to various fields, such as lights, displays, energy conversion, data encryption, sensing, and bio imaging, without requirements for an additional fluorescent substance. This will be illustratively described with reference to FIGS. 11 and 12.

Figure 11:
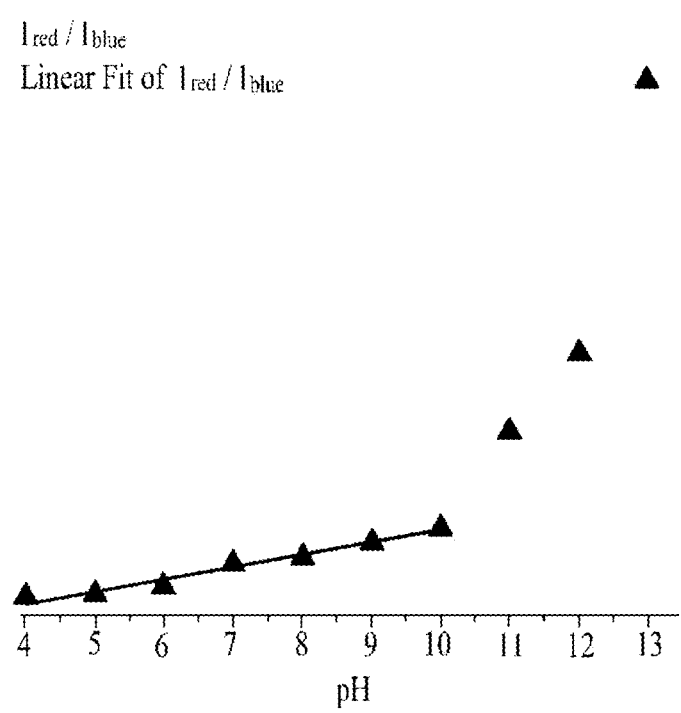
FIG. 11 is a graph for describing a pH sensing technology using carbon dots according to various embodiments.

FIG. 11 is a graph for describing a pH sensing technology using carbon dots according to various embodiments.

Referring to FIG. 11, as pH of an aqueous solution in which carbon dots are dispersed is increased from 3 to 13, a dispersibility difference occurs in the aqueous solution. Accordingly, a relative intensity of red emission of the carbon dots for blue emission continues to change. In particular, when pH of the aqueous solution in which the carbon dots are dispersed is 4 to 10, a relative intensity of red emission of the carbon dots for blue emission is linearly increased. Accordingly, pH of the aqueous solution may be sensed by dispersing carbon dots according to various embodiments within a given aqueous solution.

Figure 12:
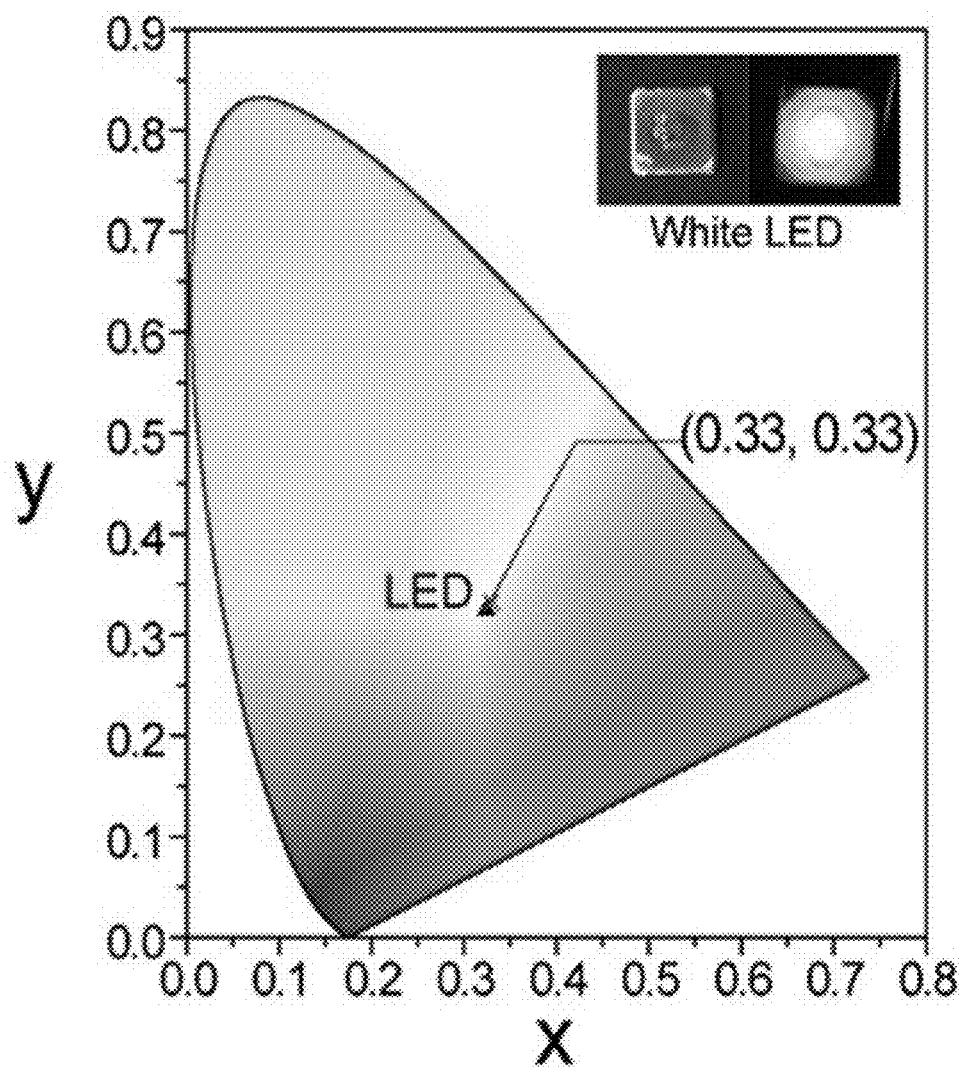
FIG. 12 is a graph for describing a technology for implementing a white light-emitting diode using carbon dots according to various embodiments.

FIG. 12 is a graph for describing a technology for implementing a white light-emitting diode using carbon dots according to various embodiments.

Referring to FIG. 12, in order to fabricate a color conversion layer based on carbon dots according to various embodiments, a polyvinylpyrrolidone (PVP) solution was generated by dissolving polyvinylpyrrolidone (PVP) of 2 g in dimethylformamide (DMF) of 8.421 mL through ultrasonic treatment. In this case, polyvinylpyrrolidone (PVP) was used to play a role as a dispersant of the color conversion layer. Thereafter, a solution 100 μm in which carbon dots according to various embodiments were dispersed in dimethylformamide (DMF) at a concentration of 8 mg/mL, and the polyvinylpyrrolidone solution (PVP) of 1 mL were mixed. Next, after the mixed solution was coated on an ultraviolet light-emitting diode chip, the coating results were dried at room temperature for 12 hours or more. Accordingly, as illustrated in FIG. 12, a white light-emitting diode based on the carbon dots was fabricated. In this case, as in color coordinates illustrated in FIG. 12, white emission was implemented using one type of dual emission carbon dots. Color coordinates corresponding to the white light-emitting diode was (0.324, 0.326), and was very close to (0.33, 0.33), that is, color coordinates corresponding to pure white light.

Carbon dots are carbon-based fluorescent nano materials, and have advantages in that they are free of toxicity and environmental pollution problems and are advantageous in low-cost mass production because a plenty of precursors are present, unlike the existing fluorescent substance including rare earth metals, heavy metals, etc. Moreover, the carbon dots are fluorescent substances, and have advantages of strong fluorescent, high photostability, etc. and are easy to be sensed through an interaction with a functional group of a target material because the carbon dots provide emission levels due to the presence of various functional groups on surfaces of the carbon dots. In particular, since the carbon dots emitting light having multiple colors can implement two or more types of different optical signals, the carbon dots are used in a photochemical sensor, a disease diagnosis kit, etc. using sensing based on a color change and can show accuracy much higher than a fluorescent substance that emits a single emission wavelength. Furthermore, if the carbon dots emitting light having multiple colors are used in lights such as a light-emitting diode, the carbon dots can implement mixed colors as one fluorescent substance even without the mixing of fluorescent substances showing different emission wavelengths. Furthermore, the carbon dots emitting light having multiple colors can be used in an energy conversion device using sunlight, etc. because they emit light having two or more types of different energy values for a given an excitation wavelength.

In addition to products which may now be applied along with the aforementioned various advantages, if the carbon dots emitting light having multiple colors are used, the carbon dots can be used in display products by adjusting multi-color emission and deriving a color change based on an electrical signal change. If a medium substance capable of dispersing and supporting the carbon dots is developed, the carbon dots can be used to sense a gas or a pollutant in the air by extending a photochemcial sensing field to a gaseous state in addition to a liquid state. Furthermore, the carbon dots can also be applied to biomass by deriving an emission wavelength advantageous for algal culture, and applicability thereof may also be expanded to data encryption, etc. through a combination of different fluorescent signals.

The carbon dots emitting light having multiple colors according to various embodiments may include at least two structural characteristics. At least two emission levels indicative of different emission wavelengths, respectively, may be introduced into the carbon dots based on the structural characteristics.

According to various embodiments, each of the emission levels may be one of a core level, the surface level, a fluorescent molecule level, or a defect level.

According to various embodiments, the carbon dots may simultaneously emit light having at least two emission colors for a given a single excitation wavelength.

According to various embodiments, each of the structural characteristics may be one of carbonaceous, a surface functional group, a fluorescent organic molecule, or a core defect structure.

According to various embodiments, a ratio of the emission colors of the carbon dots may be adjusted. The ratio of the emission colors may indicate a peak height in each of the emission wavelengths of emission spectra of the carbon dots, a height up to an internal division point of the peak height when each of the peak heights is internally divided at the same ratio, or a ratio of the peak widths.

According to various embodiments, the ratio of the emission colors may be adjusted by adjusting at least one of a level of relative emission contribution of each of emission levels or an absolute quantity of each of the emission levels.

According to various embodiments, the level of the relative emission contribution may be adjusted by exciting a solution in which the carbon dots and a dispersion solution are mixed at various wavelengths as the carbon dots are dispersed within the dispersion solution or after the carbon dots are dispersed within the dispersion solution.

According to various embodiments, the level of the relative emission contribution may be adjusted based on at least one of a concentration of the carbon dots within the dispersion solution, the type of the dispersion solution, pH of the dispersion solution, or the excited wavelength.

According to various embodiments, the absolute quantity may be adjusted based on at least one of a reaction time or a reaction temperature necessary to synthesize the carbon dots.

According to various embodiments, the carbon dots may be synthesized by dispersing at least one organic precursor within an organic solvent and reacting the organic precursors with each other within the organic solvent.

A method of fabricating carbon dots emitting light having multiple colors according to various embodiments may include step 510 of preparing at least one organic precursor and step 520 of synthesizing carbon dots by reacting the organic precursors with each other.

According to various embodiments, the carbon dots include at least two structural characteristics. At least two emission levels indicative of different emission wavelengths, respectively, may be introduced into the carbon dots based on the structural characteristics.

According to various embodiments, each of the emission levels may be one of a core level, the surface level, a fluorescent molecule level, or a defect level.

According to various embodiments, the carbon dots may simultaneously emit light having at least two emission colors for a given a single excitation wavelength.

According to various embodiments, each of the structural characteristics may be one of carbonaceous, a surface functional group, a fluorescent organic molecule, or a core defect structure.

According to various embodiments, the organic precursor may be an organic matter including a nitrogen element.

According to various embodiments, a ratio of the emission colors of the carbon dots may be adjusted. The ratio of the emission colors may indicate a peak height in each of the emission wavelengths of emission spectra of the carbon dots, a height up to an internal division point of the peak height when each of the peak heights is internally divided at the same ratio, or a ratio of the peak widths.

According to various embodiments, the ratio of the emission colors may be adjusted by adjusting at least one of a level of relative emission contribution of each of the emission levels or an absolute quantity of each of the emission levels.

According to various embodiments, the method of fabricating carbon dots may further include a step of dispersing the carbon dots within a dispersion solution in order to adjust the level of the relative emission contribution.

According to various embodiments, the level of the relative emission contribution may be adjusted based on at least one of a concentration of the carbon dots within the dispersion solution, the type of the dispersion solution, or pH of the dispersion solution.

According to various embodiments, the method of fabricating carbon dots further includes a step of exciting a solution in which the carbon dots and the dispersion solution are mixed in various wavelengths. The level of the relative emission contribution may be adjusted based on the excited wavelength.

According to various embodiments, the absolute quantity may be adjusted based on at least one of a reaction time or reaction temperature of the organic precursor within the organic solvent.

Various embodiments of this document and the terms used in the embodiments are not intended to limit the technology described in this document to a specific embodiment, but should be construed as including various changes, equivalents and/or alternatives of a corresponding embodiment. Regarding the description of the drawings, similar reference numerals may be used in similar elements. An expression of the singular number may include an expression of the plural number unless clearly defined otherwise in the context. In this document, an expression, such as "A or B", "at least one of A and/or B", "A, B or C" or "at least one of A, B and/or C", may include all of possible combinations of listed items together. Expressions, such as "a first," "a second," "the first" or "the second", may modify corresponding elements regardless of its sequence or importance, and are used to only distinguish one element from the other element and do not limit corresponding elements. When it is described that one (e.g., a first) element is "(functionally or communicatively) connected to" or "coupled with" the other (e.g., a second) element, one element may be directly connected to the other element or may be connected to the other element through another element (e.g., a third element).

According to various embodiments, each of the described elements may include a single entity or a plurality of entities. According to various embodiments, at least one element or step of the aforementioned elements may be omitted or at least one element or step may be added. Alternatively or additionally, a plurality of elements may be integrated into a single element. In such a case, the integrated element may perform a function, performed by a corresponding one of the plurality of elements before at least one function of each of the plurality of elements is integrated, identically or similarly. According to various embodiments, steps performed by a module, a program or another element may be executed sequentially, in parallel, repeatedly or heuristically, or at least one of the steps may be executed in different order or may be omitted, or at least one step may be added.

The embodiments of the invention in which an exclusive property or privilege is claimed are defined as follows:

1. Carbon dots emitting light having multiple colors, comprising:
   at least two structural characteristics,
   wherein at least two emission levels indicative of different emission wavelengths, respectively, are introduced into the carbon dots based on the at least two structural characteristics,
   the at least two structural characteristics are bonded through a chemical bond,
   each of the at least two structural characteristics is one of a carbonaceous structure, a surface functional group, a fluorescent organic molecule, or a core defect structure,
   a ratio of at least two emission colors of the carbon dots is adjusted by adjusting a level of relative emission contribution between the at least two emission levels as the carbon dots are dispersed within a dispersion solution, and
   the level of the relative emission contribution is adjusted by a type of the dispersion solution, and
   the carbon dots are synthesized by dispersing at least one organic precursor in an organic solvent and reacting the at least one organic precursor in the organic solvent by a solvent thermal synthesis method.

2. The carbon dots of claim 1, wherein each of the at least two emission levels is one of a core level, a surface level, a fluorescent molecule level, or a defect level.

3. The carbon dots of claim 1, wherein the carbon dots simultaneously emit light having at least two emission colors for a given a single excitation wavelength.

4. The carbon dots of claim 1, wherein the ratio of the at least two emission colors indicates a ratio of peak heights or peak widths of emission spectra of the carbon dots in the emission wavelengths, wherein when a peak is internally divided a height up to an internal division point is used as the peak height.

5. The carbon dots of claim 1, wherein the ratio of the at least two emission colors is adjusted by adjusting an absolute quantity of at least one of the at least two emission levels.

6. The carbon dots of claim 1, wherein the level of the relative emission contribution is adjusted by at least one of a concentration of the carbon dots within the dispersion solution, pH of the dispersion solution, or a wavelength excited in a solution in which the carbon dots and the dispersion solution are mixed.

7. The carbon dots of claim 5, wherein the absolute quantity is adjusted by at least one of a reaction time or reaction temperature necessary to synthesize the carbon dots.

8. A method of fabricating carbon dots emitting light having multiple colors, comprising:
preparing at least one organic precursor;
synthesizing the carbon dots by reacting the organic precursors with each other, wherein the carbon dots comprise at least two structural characteristics, and at least two emission levels indicative of different emission wavelengths, respectively, are introduced into the carbon dots based on the structural characteristics; and
dispersing the carbon dots within a dispersion solution in order to adjust a level of relative emission contribution between the emission levels so that a ratio of emission colors of the carbon dots is adjusted,
wherein the structural characteristics are bonded through a chemical bond,
each of the structural characteristics is one of carbonaceous, a surface functional group, a fluorescent organic molecule, or a core defect structure, and
the level of the relative emission contribution is adjusted based on a type of the dispersion solution, and
the carbon dots are synthesized by dispersing the at least one organic precursor in an organic solvent and reacting the at least one organic precursor in the organic solvent by a solvent thermal synthesis method.

9. The method of claim 8, wherein the each of the emission levels is one of a core level, a surface level, a fluorescent molecule level, or a defect level.

10. The method of claim 8, wherein the carbon dots simultaneously emit light having at least two colors for a given a single excitation wavelength.

11. The method of claim 8, wherein the organic precursor is an organic matter comprising a nitrogen element.

12. The method of claim 8, wherein the ratio of the emission colors indicates peak heights of emission spectra of the carbon dots in the emission wavelengths, a height up to an internal division point of the peak height when each of the peak heights is internally divided at the same ratio, or a ratio of the peak widths.

13. The method of claim 8, wherein the synthesizing of the carbon dots comprises adjusting a ratio of emission colors of the carbon dots by adjusting an absolute quantity of at least one of the emission levels.

14. The method of claim 8, wherein the level of the relative emission contribution is adjusted by at least one of a concentration of the carbon dots within the dispersion solution or pH of the dispersion solution.

15. The method of claim 8, further comprising exciting a solution in which the carbon dots and the dispersion solution are mixed in various wavelengths,
wherein the level of the relative emission contribution is adjusted by the excited wavelength.

16. The method of claim 13, wherein the absolute quantity is adjusted based on at least one of a reaction time or reaction temperature of the organic precursor.

* * * * *